United States Patent [19]

Higashiyama

[11] Patent Number: 4,886,773

[45] Date of Patent: Dec. 12, 1989

[54] IMAGE RECORDING SYSTEM

[75] Inventor: Shunichi Higashiyama, Nagoya, Japan

[73] Assignee: Brother Kogyo Kabushiki Kaisha, Aichi, Japan

[21] Appl. No.: 170,731

[22] Filed: Mar. 21, 1988

[30] Foreign Application Priority Data

Mar. 20, 1987 [JP] Japan ................................. 62-66281
Mar. 20, 1987 [JP] Japan ................................. 62-66282

[51] Int. Cl.$^4$ ............................................ B41M 5/22
[52] U.S. Cl. .................... 503/201; 427/152; 430/138; 430/211; 503/215; 503/226
[58] Field of Search ............................. 427/150-152; 428/913, 914; 430/138, 211; 503/201, 206, 215, 226

[56] References Cited

U.S. PATENT DOCUMENTS 3,894,168  7/1975  Brockett et al. .................... 427/150
4,399,209  8/1983  Sanders et al. ..................... 430/138
4,440,846  9/4198  4Sanders et al. .................... 430/211
4,770,972  9/1988  Nelson et al. ...................... 503/201

Primary Examiner—Bruce H. Hess
Attorney, Agent, or Firm—Kane, Dalsimer, Sullivan, Kurucz, Levy, Eisele and Richard

[57] ABSTRACT

An image recording system wherein a capsule sheet carrying thereon a plurality of microcapsules each of which envelopes therein a developing agent pressed onto a sheet-shaped member desirably selected by a user to form a layer of a developing agent on the sheet-shaped member. Thereafter, a second capsule sheet coated with a plurality of microcapsules each of which envelopes therein a dye precursor and whose mechanical strength has been varied in accordance with the image to be recorded is pressed onto the sheet-shaped member with the layer of the developing agent. The microcapsules corresponding to the image to be recorded are ruptured and the dye precursors streamed out therefrom react to the developing agent on the sheet-shaped member to develop a visible image thereon.

6 Claims, 3 Drawing Sheets

IMAGE RECORDING SYSTEM

BACKGROUND OF THE INVENTION

This invention relates to an image recording system, and more particularly to an image developing medium on which a developer is carried to react to dye precursors streamed out of microcapsules coated on a latent image carrier.

An image recording system employing the above image developing medium has been proposed in the U.S. Pat. No. 4,399,209 or Japanese Patent Provisional Publication Nos. SHO61-137749, SHO61-143738 or SHO61173981. In such an image recording system, the image developing medium (for instance, a paper sheet coated with a developing agent thereon) prepared and fabricated by Paper Makers is utilized as well as the microcapsule sheet also prepared and fabricated by Paper Makers. In the above image recording system, a latent image is first formed on the microcapsule sheet by exposing an optical image corresponding to the image to be recorded. In other words, the mechanical strength of the microcapsules coated on the area where the light is exposed varies and the microcapsules whose mechanical strength is lower are ruptured when the pressure is applied thereto, thereby the dye precursors enveloped in the ruptured microcapsules stream out and react to the color developing agent coated on the image developing medium to develop a visible image corresponding to the latent image on the microcapsule sheet.

In the prior image recording system, however, as the image developing medium prepared and fabricated by the Paper Makers must be used, it was impossible for a user to select the materials of the image developing medium as it pleases. In other words, the materials of the image developing medium are restricted to ones supplied by Paper Makers such as papers and the like, and was impossible to record the image on the image developing medium whose material is other than supplied by Paper Makers.

SUMMARY OF THE INVENTION

It is therefore an object of the invention to provide an improved image recording system capable of selecting a material of the image recording medium as the user pleases.

For the above purpose, according to this invention, there is provided an image recording system for recording an image on a sheet-shaped member which comprises:

preparing a first capsule sheet coated with a plurality of microcapsules each of which envelopes therein a developing agent;

preparing a second capsule sheet coated with a plurality of microcapsules each of which envelopes therein a dye precursor and whose mechanical strength varies when exposed to light;

pressurising said sheet-shaped member and said first capsule sheet together in a superposed state so that said microcapsules coated on said first capsule sheet are ruptured and said developing agent enveloped therein is streamed out and transferred onto said sheet-shaped member;

exposing said second capsule sheet to vary the mechanical strength of microcapsules in accordance with said image to be recorded; and pressurising said sheet-shaped member and said second capsule sheet together in a superposed state so that microcapsules on said second capsule sheet whose mechanical strength is low are ruptured and said dye precursors streamed out from the ruptured microcapsules react to said developing agent to develop a visible image on said sheet-shaped member.

With the above image recording system, as the sheet-shaped member is prepared to the image recording medium by transferring the developing agent enveloped in the microcapsules carried on the separately prepared capsule sheet, any kind of the sheet-shaped member can be used to record an image thereon if the user desires.

DESCRIPTION OF THE ACCOMPANYING DRAWINGS

DESCRIPTION OF THE EMBODIMENTS

Figure 1:
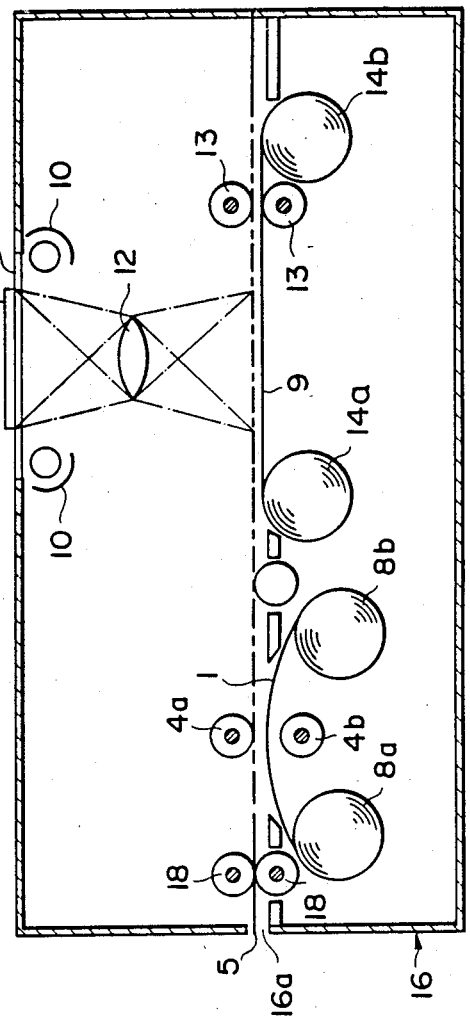
FIG. 1 is a diagramatical sectional view showing a photocopy machine embodying the invention.

FIG. 1 illustrates a photocopy machine 16 for carrying out an image recording system of the present invention.

In this photocopy machine, a sheet-shaped member 5 which is selected arbitrary by a user to print an image thereon, for instance a post card or the like, is carried into the photocopy machine 16 through an entrance opening 16a. Inside the machine 16, the sheet-shaped member 5 is guided by a pair of transferring rollers 18, 18 and passed between a pair of pressure rollers 4a, 4b.

Extended between a feeding roller 8a and a winding roller 8b is a serial developer sheet 1 which carries on one surface thereof a plurality of microcapsules each enveloping therein a developing agent. The rollers 8a and 8b are arranged to transfer the serial developer sheet 1 between the pressure rollers 4a, 4b.

Figure 2:
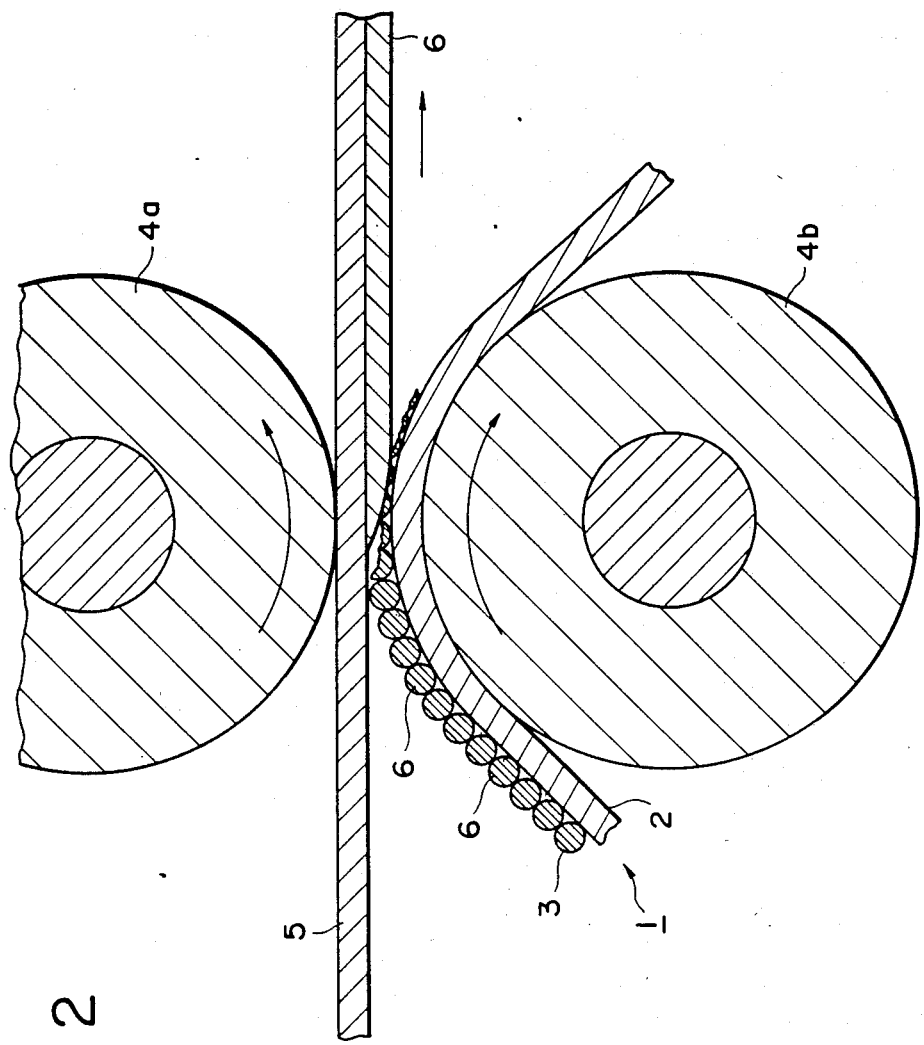
FIG. 2 is a sectional view showing an image developing medium and a microcapsule sheet in a superposed state to be pressurized by a pair of pressure rollers of the photocopy machine illustrated in FIG. 1.

Thus, as illustrated in FIG. 2, having contact with the serial developer sheet 1, the sheet-shaped member 5 passes between the rollers 4a, 4b following the movement of the serial developer sheet 1.

The microcapsules 3 coated on the serial developer sheet 1 are, then, ruptured by the pressure applied by the pressure rollers 4a, 4b and the developing agent 6 enveloped therein are streamed out therefrom. The streamed-out developing agent are then transferred onto the sheet-shaped member 5. Thus, the sheet-shaped member 5 passed between the pair of pressure rollers 4a, 4b is provided with the layer of the developing agent 6 on one surface thereof, which is used as a image recording medium in this photocopy machine.

The serial developer sheet 1 comprises a sheet-shaped supporting member 2 made of paper, PET (Polyethylene-telephthalate) or the like, and the microcapsules 3 containing therein developing agents are coated on one surface thereof which faces the sheet-shaped material 5 when passing through the pair of pressure rollers 4a, 4b.

Figure 3:
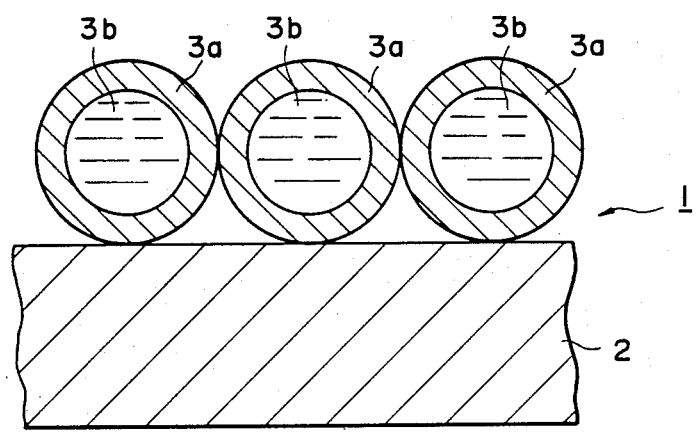
FIG. 3 is a partial enlarged sectional view of the image developing medium.

As illustrated in FIG. 3, each microcapsule 3 comprises a spherical shell 3a and the liquid component 3b enveloped therein. In the liquid component 3a, the developer agent 6 is dispersed or dissolved. The microcapsules 3 can be prepared by such a well-known technique as a core cellvation method and an interface polymerization method while enveloping therein the liquid component 3b. A binder, a filler, a viscosity adjusting agent or the like may be added into the liquid component 3b. Thus prepared microcapsules 3 are coated on the supporting member 2 with a coating roller, a spray or a doctor knife.

Turning back to FIG. 1, arranged downstream the pair of rollers 4a, 4b are a pair of feeding and winding rollers 14a, 14b. Extended between the rollers 14a, 14b is a serial capsule sheet 9 carrying a plurality of photosensitive microcapsules, not shown, on one surface thereof. Each microcapsule envelopes therein a photocurable resin as well as a dye-precursor. As the capsule sheet 9, such capsule sheet as disclosed in the U.S. Pat. Nos. 4,399,209 or 4,501,809 can be adopted.

Arranged above the area between the pair of rollers 14a, 14b is a transparent tray 11, on which a manuscript X to be copied is to be seated. A pair of light sources 10, 10 are desposed below the tray 11 to expose the manuscript X to form an optical image by the light reflected from the manuscript X. The reflected light is focused onto the capsule sheet 9 through a lens 12 which is desposed between the tray 11 and the capsule sheet 9.

The mechanical strength of microcapsules exposed to the reflected light on the capsule sheet 9 is increased as the photo-curable resin enveloped therein is set by the light exposure. Thus, the strengthened microcapsules form a latent image which corresponds to the light exposure area on the capsule sheet 9.

The above-described sheet-shaped member 5 is at a certain timing transferred onto the capsule sheet 9 so as to cover the latent image formed thereon through a transfer roller 21. Thereafter, the sheet-shaped member 5 and the capsule sheet 9 are in the superposed state passed between a pair of pressure rollers 13, 13 upon winding motion of the winding roller 14b. With the pressure applied by the pressure rollers 13, 13, the microcapsules on the capsule sheet 9 whose mechanical strength is relatively low are ruptured and the dye-precursers enveloped in the ruptured microcapsules are streamed out, which react to the developing agent carried on the sheet-shaped member 5 and the visible image corresponding to the latent image formed on the capsule sheet 9 is developed on the sheet-shaped member 5. Thus, the image on the manuscript X is copied or recorded on the sheet-shaped member 5.

Although in the above embodiment the reflecting light from the manuscript X is utilized to record the image, optical signals carrying the image information may be utilized to form the latent image on the capsule sheet 9. Further, although the pressure rollers 13, 13 are utilized to rupture the microcapsules whose mechanical strength is low, any other means can of course be adopted if the microcapsules are destroyed.

What is claimed is

1. An image recording system for recording an image on an arbitrarily selected sheet-shaped member which comprises:
   preparing a first capsule sheet coated with a plurality of microcapsules each of which envelopes therein a developing agent;
   preparing a second capsule sheet coated with a plurality of microcapsules each of which envelopes therein a dye precursor and whose mechanical strength varies when exposed to light;
   pressurising said sheet-shaped member and said first capsule sheet together in a superposed state so that said microcapsules coated on said first capsule sheet are ruptured and said developing agent enveloped therein is streamed out and transferred onto said sheet-shaped member;
   exposing said second capsule sheet to vary the mechanical strength of microcapsules in accordance with said image to be recorded; and
   pressurising said sheet-shaped member and said second capsule sheet together in a superposed state so that microcapsules on said second capsule sheet whose mechanical strength is low are ruptured and said dye precursors streamed out from the ruptured microcapsules react to said developing agent to develop a visible image on said sheet-shaped member.

2. The image recording process according to claim 1 wherein each of said microcapsules coated on said first capsule sheet comprises a spherical shell and a developing agent which is dispersed or dissolved in a liquid component enveloped in said spherical shell.

3. The image recording process according to claim 2 wherein a binder, a filler and a viscocity adjusting agent are further enveloped in said spherical shell.

4. The image recording process according to claim 2 wherein said developing agent is selected from the group consisting of clay minerals, organic acids, acidic polymers, metal salts, and the mixtures thereof.

5. The image recording process according to claim 2 wherein a photo-curable resin is further enveloped in said spherical sheel, and the mechanical strength of each of said microcapsules coated on said second capsule sheet is increased when exposed to light.

6. The image recording process according to claim 1 wherein said exposure is carried out by projecting a light against a subject which carries said image to be recorded and focusing the light reflected from said subject onto said second capsule sheet.

* * * * *